US008772809B2

(12) United States Patent
Furuki et al.

(10) Patent No.: US 8,772,809 B2
(45) Date of Patent: Jul. 8, 2014

(54) SEMICONDUCTOR LIGHT EMITTING DEVICE

(75) Inventors: Katsuyoshi Furuki, Fukuoka-ken (JP); Hironori Yamasaki, Ishikawa-ken (JP); Yukie Nishikawa, Ishikawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/599,853

(22) Filed: Aug. 30, 2012

(65) Prior Publication Data

US 2013/0221367 A1 Aug. 29, 2013

(30) Foreign Application Priority Data

Feb. 7, 2012 (JP) ................................. 2012-024096

(51) Int. Cl.
*H01L 33/00* (2010.01)
(52) U.S. Cl.
USPC ................. 257/98; 257/E33.06; 257/E33.024
(58) Field of Classification Search
USPC ................. 257/98, 99, 96, E33.06, E33.024; 438/22
See application file for complete search history.

(56) References Cited

U.S. PATENT DOCUMENTS

| | | | |
|---|---|---|---|
| 5,814,839 A * | 9/1998 | Hosoba ............................ | 257/96 |
| 8,115,192 B2 * | 2/2012 | Kondo et al. .................... | 257/13 |
| 8,143,639 B2 * | 3/2012 | Jeong et al. ...................... | 257/98 |
| 2006/0076565 A1 | 4/2006 | Murofushi et al. | |
| 2006/0189020 A1 * | 8/2006 | Kim ................................ | 438/47 |
| 2006/0270074 A1 * | 11/2006 | Kim ................................ | 438/22 |
| 2006/0273333 A1 * | 12/2006 | Wu et al. ......................... | 257/94 |
| 2007/0096116 A1 | 5/2007 | Yasuda et al. | |
| 2008/0008964 A1 * | 1/2008 | Chan et al. ............... | 430/270.13 |
| 2009/0001407 A1 * | 1/2009 | Osawa et al. .................... | 257/99 |
| 2009/0078952 A1 | 3/2009 | Horng et al. | |
| 2009/0261376 A1 * | 10/2009 | Hwang .......................... | 257/103 |
| 2009/0273003 A1 * | 11/2009 | Park ................................ | 257/99 |
| 2009/0309123 A1 * | 12/2009 | Hsu et al. ......................... | 257/99 |
| 2011/0012155 A1 * | 1/2011 | Huang et al. ..................... | 257/98 |
| 2011/0193117 A1 * | 8/2011 | Jeong et al. ..................... | 257/98 |
| 2011/0193120 A1 | 8/2011 | Kazama | |

(Continued)

FOREIGN PATENT DOCUMENTS

| | | |
|---|---|---|
| JP | 2002190620 A | 7/2002 |
| JP | 2006-100569 | 4/2006 |

(Continued)

OTHER PUBLICATIONS

U.S. Appl. No. 61/563,081, Appln. Date: Unknown.

(Continued)

*Primary Examiner* — Lex Malsawma
(74) *Attorney, Agent, or Firm* — Patterson & Sheridan, LLP

(57) ABSTRACT

According to one embodiment, a semiconductor light emitting device includes a light emitting layer, a first electrode, a first conductivity type layer, a second conductivity type layer, and a second electrode. The first electrode includes a reflection metal layer. The first conductivity type layer is provided between the light emitting layer and the first electrode. The second conductivity type layer has a first surface on the light emitting layer side and a second surface on an opposite side of the first surface. The second electrode is provided on the second surface of the second conductivity type layer. A plurarity of interfaces, provided between the first conductivity type layer and the reflection metal layer, has at least first concave-convex structures. A region of the second surface of the second conductivity type layer, where the second electrode is not provided, has second concave-convex structures.

17 Claims, 8 Drawing Sheets

(56) References Cited

U.S. PATENT DOCUMENTS

| | | |
|---|---|---|
| 2011/0198639 A1 | 8/2011 | Eberhard et al. |
| 2011/0291133 A1 | 12/2011 | Tanaka et al. |
| 2012/0018752 A1 | 1/2012 | Fujiwara et al. |
| 2012/0146072 A1 | 6/2012 | Yamasaki et al. |

FOREIGN PATENT DOCUMENTS

| | | |
|---|---|---|
| JP | 2007-123573 | 5/2007 |
| JP | 2008-066442 | 3/2008 |
| JP | 2009-525607 | 7/2009 |
| JP | 2009-206265 | 9/2009 |
| JP | 2009-259857 | 11/2009 |
| JP | 2011-508441 | 3/2011 |
| JP | 2011-142353 | 7/2011 |
| JP | 2011165853 A | 8/2011 |
| JP | 2012-129234 | 7/2012 |

OTHER PUBLICATIONS

Japanese Office Action dated Apr. 30, 2014, filed in Japanese counterpart Application No. 2012-024096, 4 pages (with translation).

* cited by examiner

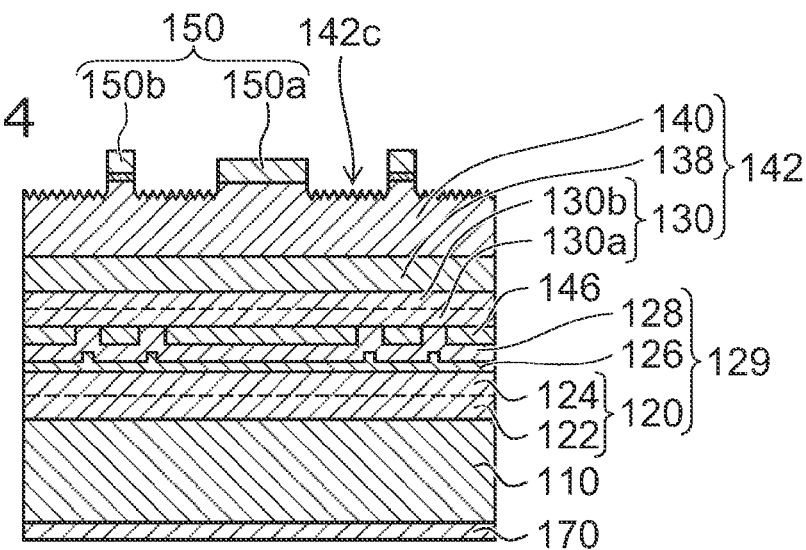
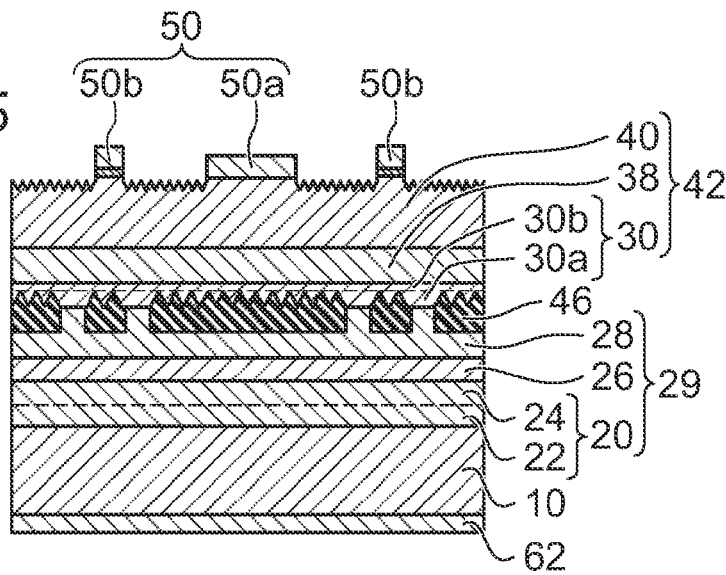
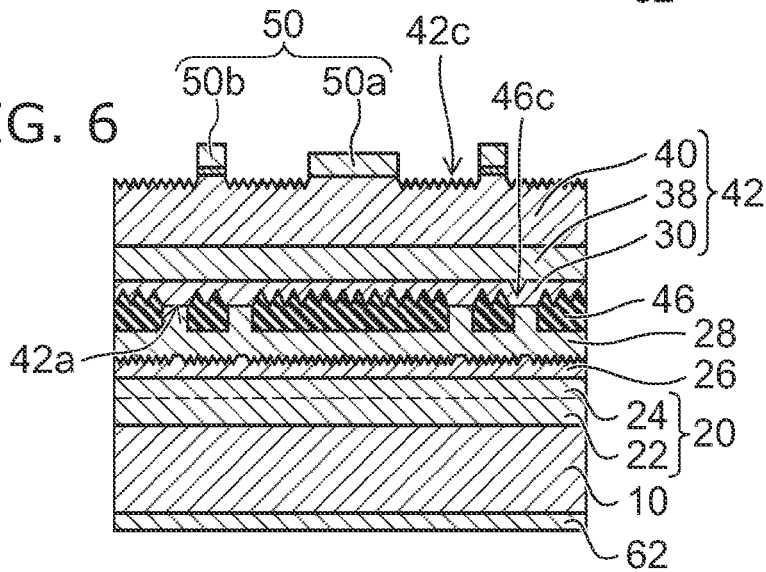

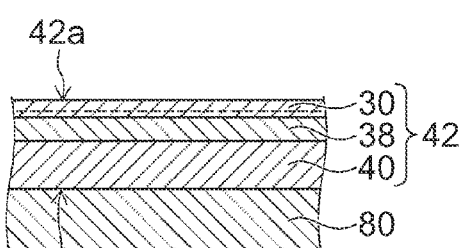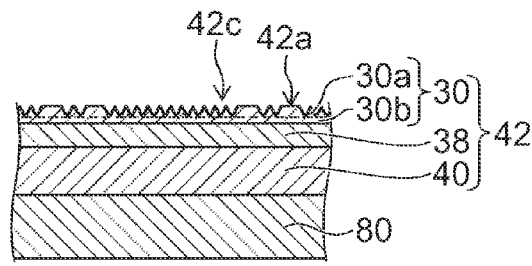
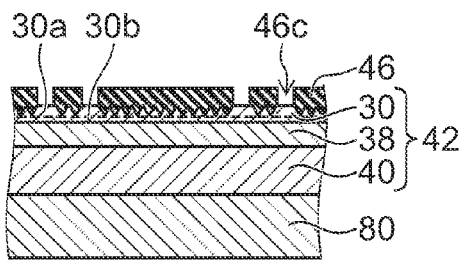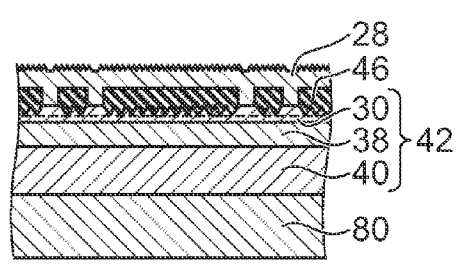
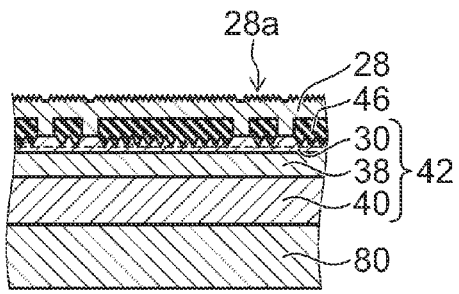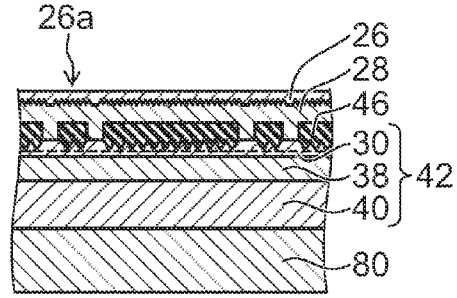
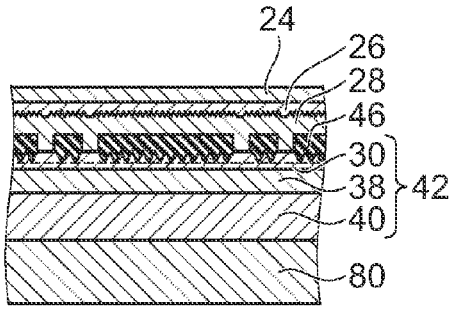

SEMICONDUCTOR LIGHT EMITTING DEVICE

CROSS-REFERENCE TO RELATED APPLICATIONS

This application is based upon and claims the benefit of priority from the prior Japanese Patent Application No. 2012-024096, filed on Feb. 7, 2012; the entire contents of which are incorporated herein by reference.

FIELD

Embodiments described herein relate generally to a semiconductor light emitting device.

BACKGROUND

It is required for semiconductor light emitting devices such as light emitting diodes (LEDs) used for lighting equipment, display devices, traffic signals, etc. to achieve high power.

If a reflection metal layer provided under a light emitting layer reflects a downward light emitted from the light emitting layer upward, light extraction efficiency can be increased. The reflection metal layer may be, for example, a portion of a bonding metal layer connecting a semiconductor stacked structure including the light emitting layer and a substrate made of silicon or the like.

An interface including different materials exists between the light emitting layer and the bonding metal layer. If the interface is flat, there is a case where the light extraction efficiency cannot be sufficiently increased.

BRIEF DESCRIPTION OF THE DRAWINGS

FIG. 4 is a schematic cross-sectional view of a semiconductor light emitting device according to a comparative example;

FIG. 5 is a schematic cross-sectional view of a semiconductor light emitting device according to a third variation of the first embodiment;

FIG. 6 is a schematic cross-sectional view of a semiconductor light emitting device according to a second embodiment;

FIGS. 8A to 8G are schematic views describing a method for manufacturing a semiconductor light emitting device of the second embodiment;

DETAILED DESCRIPTION

In general, according to one embodiment, a semiconductor light emitting device includes a light emitting layer, a first electrode, a first conductivity type layer, a second conductivity type layer, and a second electrode. The first electrode includes a reflection metal layer. The first conductivity type layer is provided between the light emitting layer and the first electrode. The second conductivity type layer has a first surface on the light emitting layer side and a second surface on an opposite side of the first surface. The second electrode is provided on the second surface of the second conductivity type layer. A plurality of interfaces, provided between the first conductivity type layer and the reflection metal layer, has at least first concave-convex structures. A region of the second surface of the second conductivity type layer, where the second electrode is not provided, has second concave-convex structures.

Various embodiments will be described hereinafter with reference to the accompanying drawings.

Figure 1A:
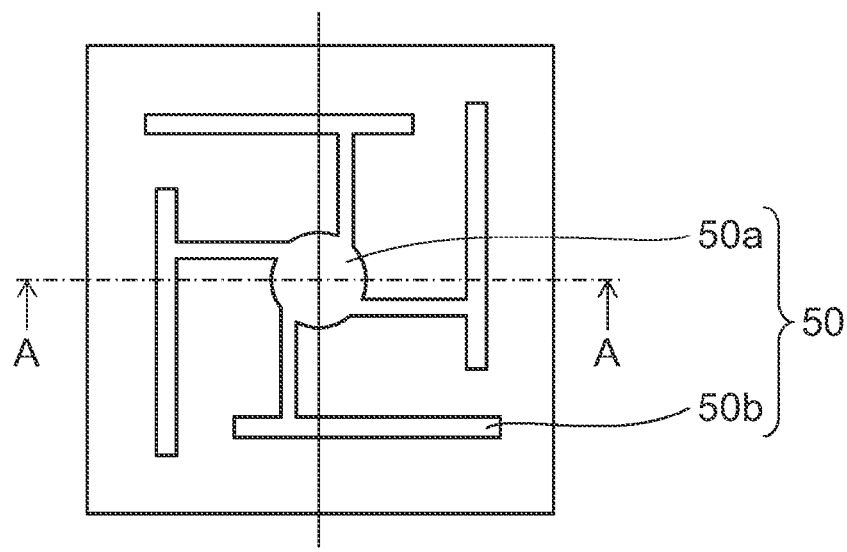
FIG. 1A is a schematic plan view of a semiconductor light emitting device according to a first embodiment.
Figure 1B:
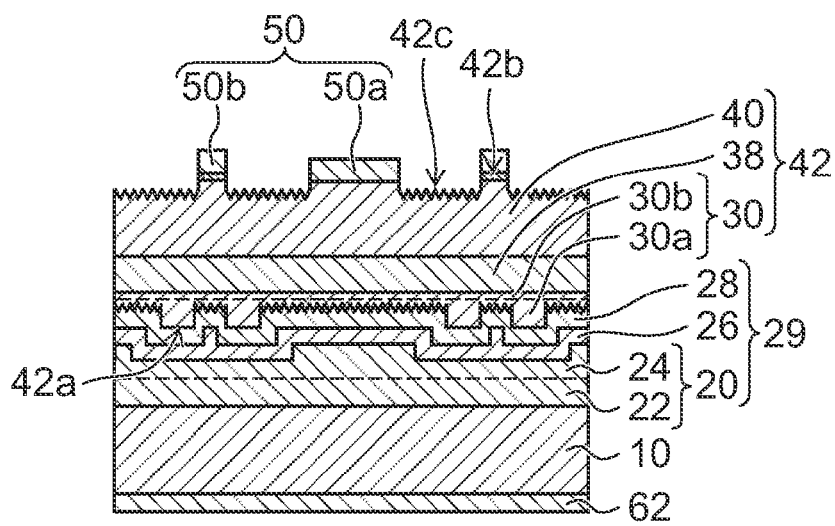
FIG. 1B is a schematic cross-sectional view taken along line A-A.

FIG. 1A is a schematic plan view of a semiconductor light emitting device according to a first embodiment, and FIG. 1B is a schematic cross-sectional view taken along line A-A.

The semiconductor light emitting device includes a support substrate 10, a first electrode 29, a semiconductor stacked structure 42, and a second electrode 50.

The support substrate 10 may be, for example, Si, SiC, or the like. The first electrode 29 includes a bonding metal layer 20 provided on the support substrate 10, a reflection metal layer 26 provided on the bonding metal layer 20 and having a light reflectance higher than the light reflectance of the bonding metal layer 20, and a transparent conductive layer 28 provided on the reflection metal layer 26. The bonding metal layer 20 may include a first metal layer 22 and a second metal layer 24 which are bonded by solid phase metal diffusion or by using a solder material. Therefore, the first metal layer 22 is provided on the support substrate 10 side and the second metal layer 24 is provided on the semiconductor stacked structure 42 side. The transparent conductive layer 28 can be omitted. Further, it is also possible to omit the second metal layer 24 and use the reflection metal layer 26 as a bonding metal for the semiconductor stacked structure 42.

By bonding the first metal layer 22 and the second metal layer 24, the semiconductor stacked structure 42 and the support substrate 10 can be integrated. When the support substrate 10 is configured to be electrically conductive, a voltage can be applied between a back surface electrode 62 provided on the back surface of the support substrate 10 and the second electrode 50 for driving the semiconductor light emitting device.

The semiconductor stacked structure 42 may include a first conductivity type layer 30, a light emitting layer 38, and a second conductivity type layer 40 from the first electrode 29 side. The semiconductor stacked structure 42 has a first surface 42a on the first electrode 29 side and a second surface 42b on the opposite side of the first surface 42a.

The semiconductor stacked structure 42 may contain, for example, an InGaAlP-based material made of $In_x(Ga_yAl_{1-y})_{1-x}P$ ($0 \leq x \leq 1$, $0 \leq y \leq 1$). In this case, GaAs and/or GaP for making ohmic contacts with electrodes may be further contained. Furthermore, a GaAlAs-based material made of $Ga_xAl_{1-x}As$ ($0 \leq x \leq 1$) may be contained.

In the following description, it is assumed that the first conductivity type layer 30 is the p type and includes a GaP layer 30a and an InGaAlP layer 30b. As the impurity concentration of the GaP layer 30a in a region in contact with the transparent conductive layer 28 is set high, the GaP layer 30a can act as an ohmic contact layer to the transparent conductive layer 28 and selective current injection in the high-concentration GaP region can be achieved. The InGaAlP layer 30b may include, for example, a cladding layer, a light guide layer, and a current spreading layer.

The second conductivity type layer 40 may be, for example, the n type, and may include a cladding layer containing an InGaAlP-based material, an optical guide layer, a current spreading layer, and a GaAs layer acting as an ohmic contact layer to the second electrode 50. The conductivity types are not limited thereto as a matter of course, and the first conductivity type layer 30 and the second conductivity type layer 40 may be the respective opposite conductivity types.

The semiconductor stacked structure 42 may be a nitride-based material made of $In_xGa_yAl_{1-x-y}N$ ($0 \leq x \leq 1$, $0 \leq y \leq 1$, $x+y \leq 1$) or the like. In this case, the contact layer may be, for example, a GaN layer having a higher concentration than the cladding layer or the like.

The first metal layer 22 may contain, for example, Au, AuIn, and/or the like. The second metal layer 24 may contain Au, AuIn, and/or the like.

The reflection metal layer 26 may be, for example, Au, Ag, Ag alloy, Al, or the like. The transparent conductive layer 28 may be ITO (indium tin oxide) or the like. In the visible light wavelength range, the light reflectance of Ag, Ag alloy, Al, and the like is higher than the light reflectance of the bonding metal layer 20 such as Au or AuIn. In particular, in the case where the light emitting layer 38 is a nitride-based semiconductor and emits blue to bluish violet light, Ag or Ag alloy with a high light reflectance is preferably used as the reflection metal layer 26.

The second electrode 50 is provided on the second surface 42b side of the semiconductor stacked structure 42, and includes a narrow wire electrode 50b capable of injecting a current into the semiconductor stacked structure 42 and a pad electrode 50a electrically connected to the narrow wire electrode 50b. The narrow wire electrode 50b may be provided, for example, so as to extend from the pad electrode 50a toward the outside as shown in FIG. 1A. Alternatively, the narrow wire electrode 50b may surround the periphery of the pad electrode 50a. As a high concentration contact layer made of GaAs is not provided under the pad electrode 50a, current injection from the pad electrode 50a is suppressed to reduce ineffective light emitting, and the light extraction efficiency can be increased. In the case where the narrow wire electrode 50b is not provided, a contact layer may be provided under the pad electrode 50a for current injection.

In the first embodiment, first concave-convex structures are provided on at least part of the first surface 42a of the semiconductor stacked structure 42. Second concave-convex structures 42c are provided on a region of the second surface 42b of the semiconductor stacked structure 42 where the second electrode 50 is not provided.

In order to inject a current selectively into a prescribed region of the first surface 42a of the semiconductor stacked structure 42, which does not overlap with the narrow wire electrode 50b as viewed from above, for example, the first concave-convex structures may not be provided and the high concentration layer of the surface of the GaP layer 30a may be left in the prescribed region. The GaP layer 30a may have two layers including a low concentration layer and a high concentration layer. The high concentration layer is left in the prescribed region where a current is selectively injected and the concave-convex structures are not provided. On the other hand, the first concave-convex structures are provided on the low concentration layer where the high concentration layer is not left. In this case, a current is injected into the contact region between the high concentration GaP layer and the transparent conductive layer 28 because the contact resistance is small, but current is not injected into the region where the first concave-convex structures are provided because the contact resistance between the low concentration GaP layer and the transparent conductive layer 28 is large. Therefore, since light emission occurs in the region not overlapping with the narrow wire electrode 50b as viewed from above, the light extraction efficiency can be increased.

Figure 2A:
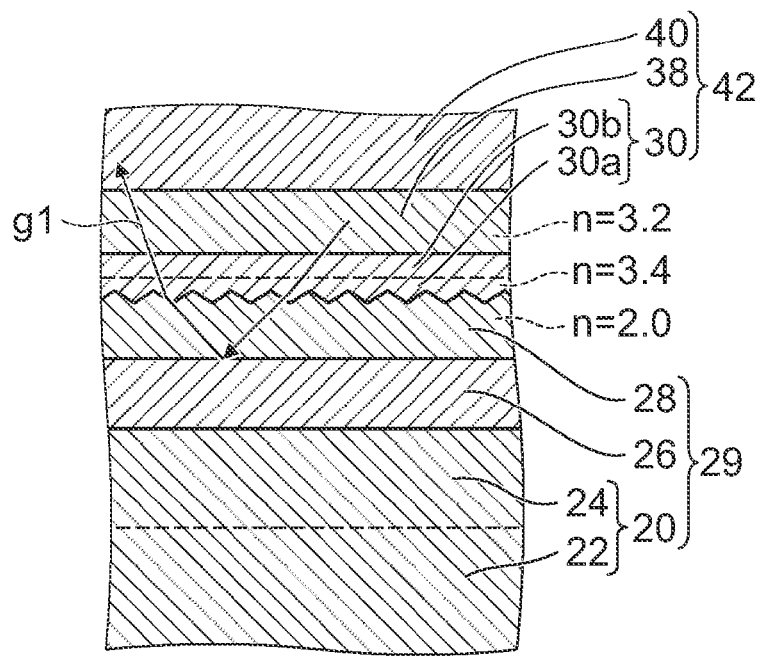
FIG. 2A is a schematic view describing the scattering and reflection of light in the first embodiment.
Figure 2B:
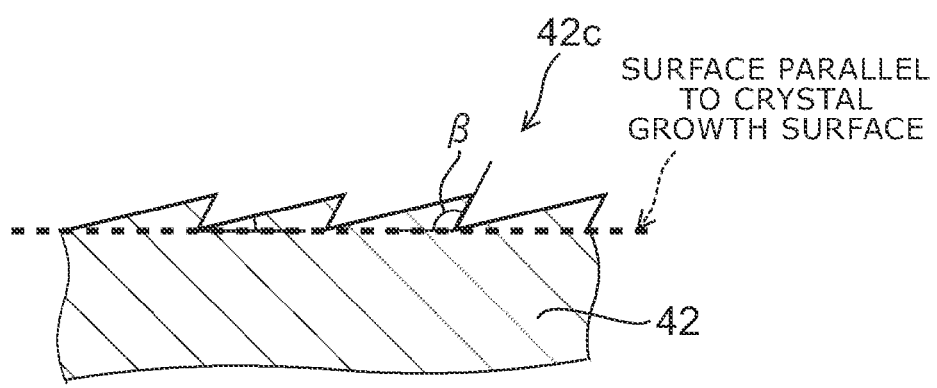
FIG. 2B is a schematic cross-sectional view of asymmetrical concave-convex structures.

FIG. 2A is a schematic view describing the scattering and reflection of light in the first embodiment, and FIG. 2B is a schematic cross-sectional view of asymmetrical concave-convex structures.

As shown in FIG. 2A, it is assumed that the light emitting layer 38 and the InGaAlP layer 30b are made of an InGaAlP-based material and with a refractive index of approximately 3.2. The GaP layer 30a has a refractive index of approximately 3.4. It is assumed that the transparent conductive layer 28 is made of ITO (refractive index: approximately 2.0) and with a refractive index of approximately 2.0. The upward light emitted from the light emitting layer 38 is emitted upward from the region where the second concave-convex structures 42c are provided.

If the concave-convex structures are not provided on the GaP layer 30a, the downward light emitted from the light emitting layer 38, being incident into the transparent conductive layer 28 with a small refractive index through the GaP layer 30a with a large refractive index, with the incident angle of the interface greater than the critical angle, is totally reflected and travels upward. In this case, part of the light may go out from the side surface of the device, and the light extraction efficiency is decreased. On the other hand, the light, being incident with an angle smaller than the critical angle, enters the transparent conductive layer 28 and is reflected at the reflection metal layer 26 to travel upward. Although the upward light reflected at the reflection metal layer 26 travels again toward the interface between the transparent conductive layer 28 and the GaP layer 30a, part of the light is reflected at the interface and light goes out from the side surface of the element and hence the light extraction efficiency is decreased.

In contrast, in the first embodiment, for light being incident into the transparent conductive layer 28 with a small refractive index through the GaP layer 30a with a large refractive index, a graded index of refraction can be effectively provided due to the first concave-convex structures on the GaP layer 30a. Therefore, the quantity of upward light totally reflected at the interface is relatively decreased. Thus, the quantity of light going out from the side surface of the device can be reduced. On the other hand, the quantity of light entering the transparent conductive layer 28 is relatively increased. The light, being incident into the transparent conductive layer 28 and reflected upward at the reflection metal layer 26, travels again toward the interface between the transparent conductive layer 28 and the GaP layer 30a. As light scattering occurs at the interface between the transparent conductive layer 28 and the GaP layer 30a due to the concave-convex structures on the GaP layer 30a, it becomes possible to reduce the portion of light which is reflected at the interface and goes out. Thus, upward light is increased as indicated by light g1 shown in FIG. 2A, and consequently the light extraction efficiency can be improved as compared to the case where no concave-convex structures are provided on the GaP layer 30a.

Although the configuration of the first concave-convex structures and the second concave-convex structures 42c may be periodic or non periodic, the pitch of the concave-convex structures are preferably set to approximately the in-medium wavelength of the emitted light from the light emitting layer 38 or longer than that because the effect of light scattering can be enhanced.

As shown in FIG. 2B, for the cross sections of the second concave-convex structures 42c, one of the base angles may be greater than 90 degrees. In this case, the area of the surface where reflection occurs can be effectively increased, and the light extraction efficiency can be increased. This is because the light reflection is substantially increased with proportion to the area of the reflection surface. In particular, since the second concave-convex structures 42c serve as a light extraction surface from a semiconductor with a large refractive index to a resin with a small refractive index, the effect of making its cross section a triangle in which one base angle with greater than 90 degrees is greatly obtained. Also, the first concave-convex structures may have cross-sectional shape of triangle and one base angle of the convex structures may be greater than 90 degrees.

Figure 3A:
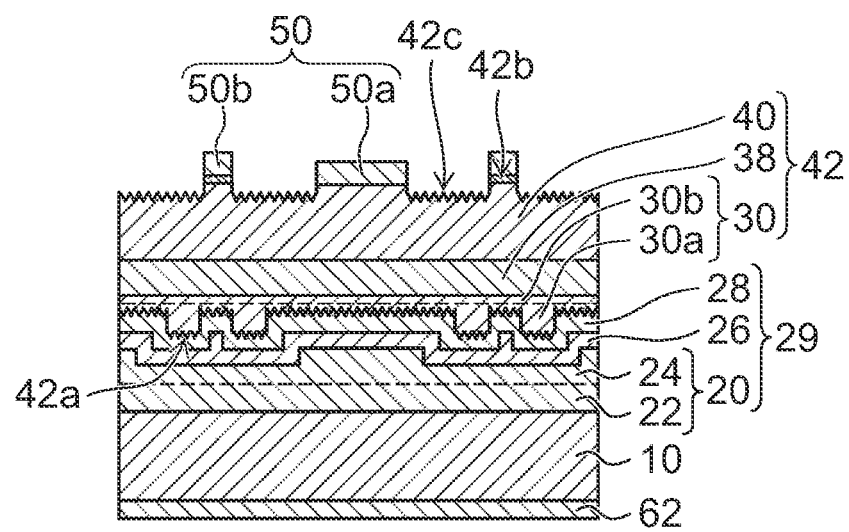
FIG. 3A is a schematic cross-sectional view of a first variation of the first embodiment.
Figure 3B:
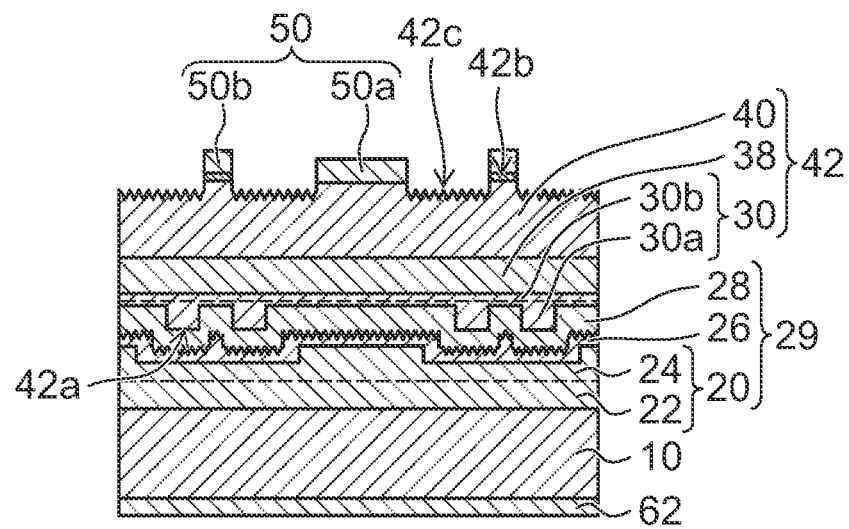
FIG. 3B is a schematic cross-sectional view of a second variation of the first embodiment.

FIG. 3A is a schematic cross-sectional view of a first variation of the first embodiment, and FIG. 3B is a schematic cross-sectional view of a second variation of the first embodiment.

As shown in FIG. 3A (the first variation of the first embodiment), the first concave-convex structures may be provided on the entire surface of the GaP layer 30a of the first conductivity type layer 30. In order to inject a current selectively into a prescribed region of the first surface 42a of the semiconductor stacked structure 42 which does not overlap with the narrow wire electrode 50b as viewed from above, the high concentration layer of the GaP layer 30a may be left in the prescribed region. In this case, the GaP layer 30a may include two layers of a low concentration layer and a high concentration layer. The high concentration layer is left in the region where a current is selectively injected. On the other hand, the high concentration layer is not left and the low concentration layer is located in the region where the the current is not injected. In this case, a current is injected into the contact region between the high concentration GaP layer and the transparent conductive layer 28 due to the low contact resistance, but no current is injected into the contact region between the low concentration GaP layer and the transparent conductive layer 28 due to the high contact resistance. As light emission occurs in the region not overlapping with the narrow wire electrode 50b as viewed from above, the light extraction efficiency can be increased.

As shown in FIG. 3B (the second variation of the first embodiment), the first concave-convex structures may be provided at the interface between the transparent conductive layer 28 and the reflection metal layer 26. In order to inject a current selectively into a prescribed region of the first surface 42a of the semiconductor stacked structure 42 does not overlap with the narrow wire electrode 50b as viewed from above, the high concentration layer of the GaP layer 30a may be left in the prescribed region. In this case, the GaP layer 30a may include two layers of a low concentration layer and a high concentration layer. The high concentration layer is left in the region into which a current is selectively injected. On the other hand, the high concentration layer is not left and the low concentration layer is located in the region where no current is injected. In this case, a current is injected into the contact region between the high concentration GaP layer and the transparent conductive layer 28 due to the low contact resistance, but no current is injected into the contact region between the low concentration GaP layer and the transparent conductive layer 28 due to the high contact resistance. As light emission occurs in the region not overlapping with the narrow wire electrode 50b as viewed from above, the light extraction efficiency can be increased.

Furthermore, the concave-convex structures may be provided on both surfaces of the transparent conductive layer 28. The concave-convex shape of the interface between the first conductivity type layer 30 and the transparent conductive layer 28 can be different from that between the transparent conductive layer 28 and the reflection metal layer 26. By providing the concave-convex structures on both surfaces of the transparent conductor layer 28, both of the effects explained in the first embodiment and the second variation can be obtained.

FIG. 4 is a schematic cross-sectional view of a semiconductor light emitting element according to a comparative example.

In the comparative example, the concave-convex structures 142c are provided on a second surface of a semiconductor stacked structure 142. The concave-convex structures 142c are fine concave-convex structures formed by frost treatment etc. In this case, the upward light emitted from a light emitting layer 138 is incident into the concave-convex structures 142c on the surface of the semiconductor stacked structure 142, and is emitted with scattering of the concave-convex structures 142c. Therefore, the light extraction efficiency can be increased.

However, no concave-convex structures are provided at the interface between a first contact layer 130a and a first electrode 129 including a transparent conductive layer 128. As the downward light emitted from the light emitting layer 138 is incident into an insulating layer 146 with a small refractive index through the first contact layer 130a with a large refractive index, the light incident into the interface with an angle greater than the critical angle is totally reflected and travels upward. In this case, part of the light may go out from the side surface of the device, and the light extraction efficiency is decreased. On the other hand, the light incident with an angle smaller than the critical angle enters the transparent conductive layer 128 through the insulating layer 146, and is reflected at a reflection metal layer 126 to travel upward. Although the upward light reflected at the reflection metal layer 126 travels again toward the interface between the transparent conductive layer 128 and the first contact layer 130a, part of the light is reflected at the interface and light goes out from the side surface of the device and hence the light extraction efficiency is decreased.

In contrast, in the first embodiment, total reflection is reduced by the first concave-convex structures provided on the interface between the GaP layer 30a and the transparent conductive layer 28, and the portion of light entering the transparent conductive layer 28 is increased. Furthermore, as shown in FIG. 2A, it becomes easy for light g1 reflected by the reflection metal layer 26 to travel upward by scattering of the first concave-convex structures. That is, as light going to the lateral side is reduced, the light extraction efficiency can be increased. The inventors' experiment has shown that the semiconductor light emitting device according to the first embodiment achieved a luminance of approximately 120% higher than that of the comparative example.

FIG. 5 is a schematic cross-sectional view of a semiconductor light emitting element according to a third variation of the first embodiment.

An insulating layer 46 made of $SiO_2$ or the like may be provided on the GaP layer 30a with the first concave-convex structures. By providing the insulating layer 46 made of $SiO_2$ or SiON between the first concave-convex structures and the transparent conductive layer 28, the current injection region can be more limited. Openings are provided in the insulating layer 46. As the GaP layer 30a and the transparent conductive layer 28 are in contact in the openings, a current can be injected. In particular, in an LED requiring a large driving current of 100 mA or more, the insulating layer 46 is preferably provided, and a sufficient current blocking effect is obtained even in a high current injection. The insulating layer 46 may have a thickness larger than the height of the concave-convex structures, and the transparent conductive layer 28 provided on the insulating layer 46 with substantially flat surface.

The insulating layer 46 preferably has a thickness of 30 to 200 nm. In the case where the insulating layer 46 is thinner than 30 nm and the coverage of the insulating layer 46 is not sufficient, there is a concern that a pin hole may remain and a current may leak from the pinhole region. On the other hand, in the case where the insulating layer 46 is thicker than 200 nm, the step height at the openings of the insulating layer 46 becomes large, and there is a concern that the openings of the insulating layer 46 may not be sufficiently buried by the transparent conductive layer 28 and/or the reflection metal layer 26. At the interface between the insulating layer 46 and the transparent conductive layer 28, it is possible to provide no concave-convex structures, or to remain concave-convex shape reflecting the first concave-convex structures formed on the GaP layer 30a may be formed. Alternatively, a concave-convex configuration different from that of the first concave-convex structures can be formed.

FIG. 6 is a schematic cross-sectional view of a semiconductor light emitting device according to a second embodiment.

The semiconductor light emitting device further includes the insulating layer 46 between the first surface 42a of the semiconductor stacked structure 42 and the transparent conductive layer 28. Openings 46c are provided in the insulating layer 46. A region of the first surface 42a at the openings 46c is in contact with the transparent conductive layer 28. In the second embodiment, the first concave-convex structures are provided on the interface between the GaP layer 30a and the insulating layer 46. The second concave-convex structures 42c are provided on a region of the second surface 42b of the semiconductor stacked structure 42 where the second electrode 50 is not provided.

Further, third concave-convex structures are provided on the interface between the transparent conductive layer 28 and the reflection metal layer 26. Forth concave-convex structures may be provided on the interface between the reflection metal layer 26 and the bonding metal layer 20. Although the third and fourth concave-convex structures may be periodic or non periodic, it is preferable that the pitch of the concave-convex structures are approximately same as the in-medium wavelength of the emitted light from the light emitting layer 38 or longer than that because the effect of light scattering can be enhanced.

Figure 7A:
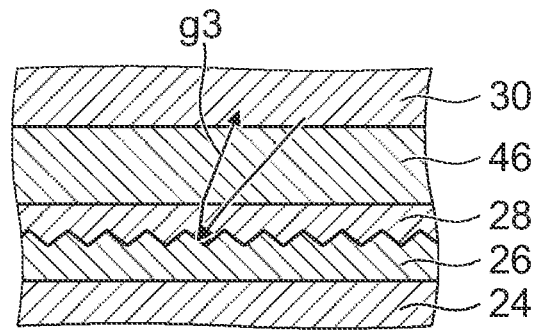
FIG. 7A is a schematic view describing the scattering and reflection of light at the surface of the reflection metal layer of the second embodiment.
Figure 7B:
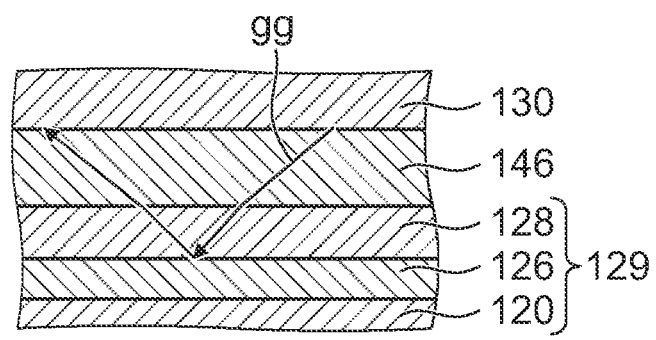
FIG. 7B is a schematic view describing the scattering and reflection of light at the surface of the reflection metal layer in the comparative example.

FIG. 7A is a schematic view describing the scattering and reflection of light at the surface of the reflection metal layer in the second embodiment, and FIG. 7B is a schematic view describing the scattering and reflection of light at the surface of the reflection metal layer in the comparative example.

As shown in FIG. 7A, in the semiconductor light emitting device according to the second embodiment, the concave-convex structures are provided on the interface between the transparent conductive layer 28 and the reflection metal layer 26. Such a structure can be obtained by forming the reflection metal layer 26 on the concave-convex surface of the transparent conductive layer 28 by maintaining the concave-convex shape of the transparent conductive layer 28. Light g3 traveling through the transparent conductive layer 28 to be incident on the surface of the reflection metal layer 26 is reflected by the fine concave-convex structures and travels upward. As the portion of the reflected light is substantially proportional to the area of the reflection surface, it can be increased by increasing the area of the reflection surface due to the concave-convex structures on the reflection metal layer 26. Consequently, the light extraction efficiency can be increased.

Although the configurations of the first and second concave-convex structures may be periodic or non periodic, it is preferable that the pitch of the concave-convex structures are approximately same as the in-medium wavelength of the emitted light from the light emitting layer 38 or longer than that because the effect of light scattering can be enhanced. The first and second concave-convex structures may have a cross-section of a triangle in which one base angle has an angle greater than 90 degrees. In this case, the area of the surface where reflection occurs can be effectively increased, and a light extraction efficiency can be increased. This is because the portion of reflected light is substantially proportional to the area of the reflection surface. In particular, as the second concave-convex structures serve as a light extraction surface from the semiconductor stacked structure 42 with a large refractive index to a sealing resin layer with a small refractive index, the effect of making its cross section a triangle in which one base angle has an angle greater than 90 degrees is greatly obtained.

FIG. 7B shows the reflection of light in the semiconductor light emitting device according to the comparative example shown in FIG. 4. Light gg traveling through the transparent conductive layer 128 is reflected by the reflection metal layer 126. If the incident angle is large, the portion of light traveling to the lateral side is increased and the portion of upward light is decreased resulting in decrease of extracting light.

The inventors' experiment has shown that the semiconductor light emitting device according to the second embodiment achieved luminance of approximately 130% higher than that of the comparative example.

FIGS. 8A to 8G are schematic views describing a method for manufacturing a semiconductor light emitting device of the second embodiment. That is, FIG. 8A is a schematic cross-sectional view of the semiconductor stacked structure formed on a crystal growth substrate, FIG. 8B is a schematic cross-sectional view in which the first concave-convex structures are formed, FIG. 8C is a schematic cross-sectional view in which the insulating layer having openings is formed, FIG. 8D is a schematic cross-sectional view in which the transparent conductive layer is formed, FIG. 8E is a schematic cross-sectional view in which the second concave-convex structures are formed, FIG. 8F is a schematic cross-sectional view in which the reflection metal layer having concave-convex structures at both surfaces is formed, and FIG. 8G is a schematic cross-sectional view in which the first metal layer is formed.

On the crystal growth substrate 80 made of GaAs, the semiconductor stacked structure 42 is formed in which at least a contact layer of n-type GaAs (carrier concentration: $1 \times 10^{18}$ cm$^{-3}$, thickness: 0.1 µm), a current spreading layer of n-type $In_{0.5}(Ga_{0.3}Al_{0.7})_{0.5}P$ (carrier concentration: $1.6 \times 10^{18}$ cm$^{-3}$, thickness: 3.5 µm), a second cladding layer of n-type $In_{0.5}Al_{0.5}P$ (carrier concentration: $4 \times 10^{17}$ cm$^{-3}$, thickness: 0.6 µm), the light emitting layer 38, the InGaAlP layer 30b including a first cladding layer of p-type $In_{0.5}Al_{0.5}P$ (carrier concentration: $3 \times 10^{17}$ cm$^{-3}$, thickness: 0.6 µm), and the p-type GaP layer 30a (impurity concentration: $5 \times 10^{20}$ cm$^{-3}$, thickness: 0.2 to 0.8 μm) are stacked in this order (FIG. 8A).

The light emitting layer 38 may be an MQW (multi-quantum well) structure including a well layer made of In$_{0.5}$Ga$_{0.5}$P with a thickness of 4 nm and a barrier layer made of In$_{0.5}$(Ga$_{0.4}$Al$_{0.6}$)$_{0.5}$P and with a thickness of 7 nm. The light emitting layer 38 can emit light in the red light wavelength range of 0.61 to 0.7 μm. The structure of the semiconductor stacked structure 42 is not limited thereto. The semiconductor layer 38 can be formed by crystal growth technique, for example, the MOCVD (metal organic chemical vapor deposition) method, the MBE (molecular beam epitaxy) method, etc.

Subsequently, as shown in FIG. 8B, concave-convex structures are formed at the surface of the GaP layer 30a using the wet etching method etc. In this case, the thickness of the GaP layer 30a may be set in a range of 0.2 to 0.8 μm, and the height of the concave-convex structures may be set approximately the half thickness of the GaP layer 30a. It is also possible to form no concave-convex structures in a region of the GaP layer 30a in contact with the first electrode.

Subsequently, as shown in FIG. 8C, the insulating layer 46 made of SiO$_2$ or the like is formed, and the openings 46c are provided. The GaP layer 30a is exposed at the opening 46c. The concave-convex structures in contact with the insulating layer 46 can be made on the InGaAlP layer 30b.

Subsequently, the transparent conductive layer 28 is formed. The transparent conductive layer 28 may have a thickness of 40 to 200 nm. Further, as shown in FIG. 8E, concave-convex structures are formed on the surface of the transparent conductive layer 28 using the dry etching method such as RIE (reactive ion etching) or the wet etching method. Although the fine concave-convex structures may be periodic or non periodic, it is preferable that the pitch of the concave-convex structures is approximately same as the in-medium wavelength of the emitted light from the light emitting layer 40 or longer than that because the effect of light scattering can be enhanced. The concave-convex structures may have cross-sectional configurations of triangles in which one base angle has an angle greater than 90 degrees. In this case, the area of the surface where reflection occurs can be effectively increased, and a light extraction efficiency can be increased.

Subsequently, as shown in FIG. 8F, the reflection metal layer 26 is formed. By making the reflection metal layer 26 thin, the concave-convex shape is transferred to the surface of the reflection metal layer 26. The reflection metal layer 26 may have a thickness of not less than 100 nm and not more than 500 nm. If the reflection metal layer 26 is thinner than 100 nm, light may penetrate the reflection metal layer 26 and the reflection metal layer 26 does not work sufficiently as the reflection layer. On the other hand, if the thickness of the reflection metal layer 26 is 500 nm or more and the reflection metal layer 26 of the device edge is necessary to remove, the large step of the reflection metal layer 26 may be formed at the device edge and may be difficult to be buried by the bonding metal. Subsequently, as shown in FIG. 8G, the second bonding metal layer 24 is formed. The second bonding metal layer 24 may be, for example, Au, AuIn, or the like.

Figure 9A:
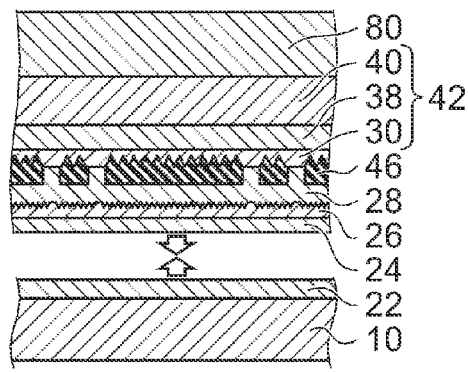
FIGS. 9A to 9E are schematic views showing the manufacturing method of the second embodiment.
Figure 9B:
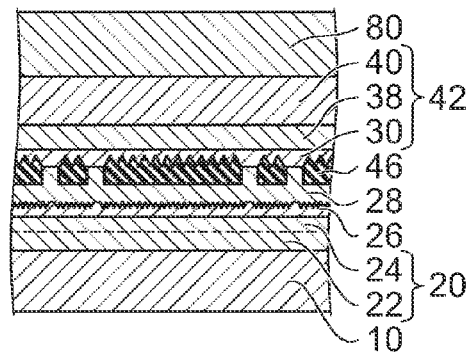
Figure 9C:
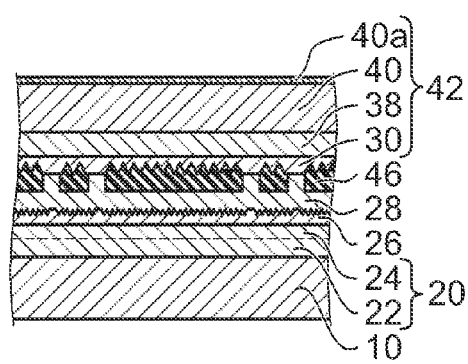
Figure 9D:
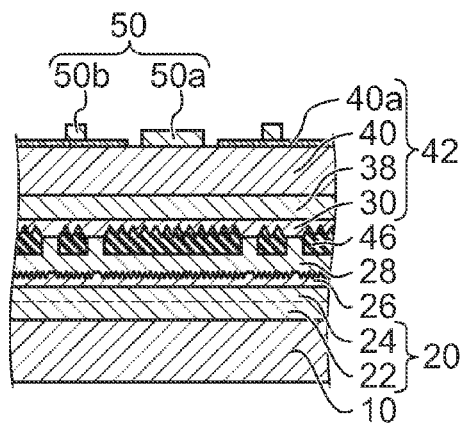
Figure 9E:
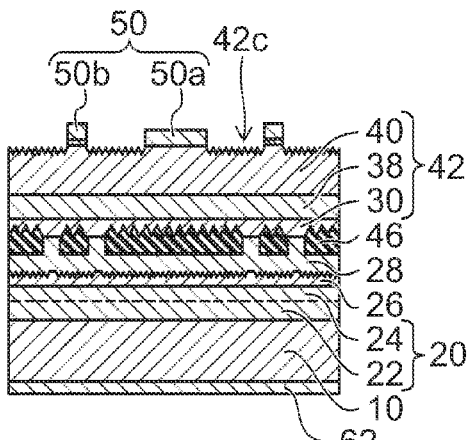

FIGS. 9A to 9E are schematic views describing the method for manufacturing a semiconductor light emitting device of the second embodiment. That is, FIG. 9A is a schematic view describing wafer bonding, FIG. 9B is a schematic cross-sectional view after bonding, FIG. 9C is a schematic cross-sectional view in which the crystal growth substrate is removed, FIG. 9D is a schematic cross-sectional view in which concave-convex structures are formed on the second surface of the first conductivity type layer, and FIG. 9E is a schematic cross-sectional view after the second electrode is formed.

On the support substrate 10 made of Si, SiC, or the like with high electrical conductivity, a barrier metal layer containing Ti, Pt, Ni, or the like and the first bonding metal layer 22 including a Au layer, a AuIn layer, or the like and provided on the barrier metal layer are formed in this order.

As shown in FIG. 9B, the second bonding metal layer 24 above the semiconductor stacked structure 42 formed on the crystal growth substrate 80 and the first bonding metal layer 22 on the support substrate 10 side are stacked, and then wafer bonding is performed by heating and pressurization.

Subsequently, as shown in FIG. 9C, the crystal growth substrate 80 is removed using grinding, or the wet etching method, etc. The surface of the second conductivity type layer 40 exposed by removing the crystal growth substrate 80 includes a contact layer 40a made of, for example, GaAs. As shown in FIG. 9D, the contact layer 40a in a region to be located under the pad electrode 50a is removed and the pad electrode 50a is formed on the surface where the contact layer 40a is removed. The narrow wire electrode 50b is formed on the contact layer 40a. The second electrode 50 including the pad electrode 50a and the narrow wire electrode 50b may be a stacked metal structure, for example, with AuGe, Au, in this order on the second conductivity type layer 40. If the narrow wire electrode 50b is not provided, the contact layer 40a is left under the pad electrode 50a.

In the case where the semiconductor stacked structure 42 is made of a nitride-based material, the crystal growth substrate 80 may be sapphire, Si, SiC, or the like. The sapphire substrate can be removed using the laser lift-off method etc. Si and SiC can be removed using grinding or the wet etching method.

Furthermore, as shown in FIG. 9E, the contact layer 40a except the region under the narrow wire electrode 50b is removed. Then, concave-convex structures are formed on the surface of the exposed second conductivity type layer 40 by frost treatment etc. The back surface electrode 62 made of Ti/Pt/Au or the like is formed on the back surface of the support substrate 10. Then, the wafer is divided into chips.

Figure 10:
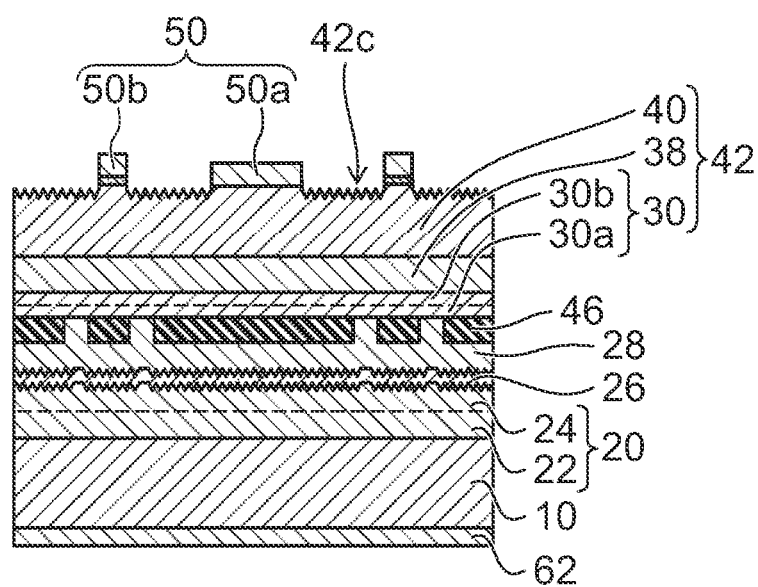
FIG. 10 is a schematic cross-sectional view of a semiconductor light emitting device according to a third embodiment.

FIG. 10 is a schematic cross-sectional view of a semiconductor light emitting device according to a third embodiment.

In the third embodiment, the first concave-convex structures are formed on the interface between the reflection metal layer 26 and the transparent conductive layer 28. The third concave-convex structures are formed on the interface between the reflection metal layer 26 and the bonding metal layer 20. No concave-convex structures are formed on the first conductivity type layer 30. The transparent conductive layer 28 has a thickness in a range of, for example, 40 to 200 nm. The average of the height calculated from the difference between the peaks and the bottoms of the concave-convex structures may be set to be the half thickness of the transparent conductive film 28. Even when the third concave-convex structures are formed on the reflection metal layer 26 side of the second metal layer 24, a flat bonding interface with the first metal layer 22 can be made by using a solder material such as AuIn as the second metal layer 24.

The downward light emitted from the light emitting layer 38, being reflected and refracted repeatedly at the interfaces the semiconductor stacked structure 42, the transparent conductive layer 28, the insulating layer 46, etc., is incident into the reflection metal layer 26. The incident light is reflected with scattering by the concave-convex structures of the surface of the reflection metal layer 26. As indicated by light g3 shown in FIG. 7A, the high portion of scattered light can be extracted on the upper side. Consequently, the light extraction efficiency is increased. The semiconductor light emitting device according to the third embodiment achieved luminance of approximately 115% higher than that of the comparative example. The concave-convex structures may have cross sections of triangles in which one base angle has an angle greater than 90 degrees. In this case, the area of the surface where reflection occurs can be effectively increased, and light extraction efficiency can be increased.

The semiconductor light emitting devices according to the first to third embodiments and their accompanying variations have at least the first concave-convex structures on the plurality of interfaces between the light emitting layer and the reflection electrode, and have the second concave-convex structures on the light extraction surface. Therefore, the light extraction efficiency and the luminance can be enhanced. Such semiconductor light emitting devices will be widely used for lighting equipment, display devices, traffic signals, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a light emitting layer;
   a first electrode including a reflection metal layer;
   a first conductivity type layer between the light emitting layer and the first electrode;
   a second conductivity type layer having a first surface on a light emitting layer side and a second surface on a side opposite the first surface;
   a second electrode on the second surface of the second conductivity type layer;
   a plurality of first concave-convex structures on at least a portion of a surface of the first conductivity type layer that is between the first conductivity type layer and the reflection metal layer; and
   an insulating layer between the first conductivity type layer and the first electrode, the insulating layer having openings through which the first conductivity type layer and the first electrode are in contact.

2. The device according to claim 1, wherein first concave-convex structures are on at least part of an interface of the first conductivity type layer and the insulating layer.

3. A semiconductor light emitting device comprising:
   a light emitting layer;
   a first electrode including a reflection metal layer;
   a first conductivity type layer between the light emitting layer and the first electrode;
   a second conductivity type layer having a first surface on a light emitting layer side and a second surface on a side opposite the first surface;
   a second electrode on the second surface of the second conductivity type layer;
   a plurality of first concave-convex structures on at least a portion of a surface of the first conductivity type layer that is between the first conductivity type layer and the reflection metal layer; and
   a support substrate on which the first electrode is disposed, the first electrode further including a bonding metal layer between the support substrate and the reflection metal layer, the bonding metal layer having a light reflectance that is less than a light reflectance of the reflection metal layer.

4. A semiconductor light emitting device comprising:
   a light emitting layer;
   a first electrode including a reflection metal layer and a transparent conductive layer;
   a first conductivity type layer between the light emitting layer and the transparent conductive layer of the first electrode;
   a second conductivity type layer having a first surface on a light emitting layer side and a second surface on a side opposite the first surface;
   a second electrode provided on the second surface of the second conductivity type layer; and
   a plurality of first concave-convex structures on at least a portion of a surface of the first conductivity type layer that is between the first conductivity type layer and the reflection metal layer,
   the first concave-convex structures on at least part of an interface of the first conductive type layer and the transparent conductive layer.

5. The device according to claim 4, wherein third concave-convex structures are on at least part of an interface of the transparent conductive layer and the reflection metal layer.

6. A semiconductor light emitting device comprising:
   a light emitting layer;
   a first electrode including a reflection metal layer and a transparent conductive layer;
   a first conductivity type layer provided between the light emitting layer and the transparent conductive layer of the first electrode;
   a second conductivity type layer having a first surface on a light emitting layer side and a second surface on a side opposite side first surface;
   a second electrode provided on the second surface of the second conductivity type layer;
   a plurality of first concave-convex structures on at least a portion of a surface of the first conductivity type layer that is between the first conductivity type layer and the reflection metal layer; and
   a support substrate on which the first electrode is disposed, the first electrode further including a bonding metal layer between the support substrate and the reflection metal layer, the bonding metal layer having a light reflectance that is less than a light reflectance of the reflection metal layer, and
   the light emitting layer, the first conductivity type layer, and the second conductivity type layer including one of $In_x(Al_yGa_{1-y})_{1-x}P(0 \le x \le 1, 0 \le y \le 1), Al_xGa_{1-x}As(0 \le x \le 1)$, and $In_xAl_yGa_{1-x-y}N(0 \le x \le 1, 0 \le y \le 1, x+y \le 1)$.

7. A semiconductor light emitting device comprising:
   a light emitting layer;
   a first electrode including a reflection metal layer and a transparent conductive layer;
   a first conductivity type layer between the light emitting layer and the transparent conductive layer;
   a second conductivity type layer having a first surface on a light emitting layer side and a second surface on a side opposite the first surface;
   a second electrode on the second surface of the second conductivity type layer;
   an insulating layer between the first conductivity type layer and the first electrode and having openings; and a plurality of first concave-convex structures on at least a portion of a surface of first conductivity type layer that is between the first conductivity type layer and the reflection metal layer.

8. The device according to claim 7, wherein first concave-convex structures are on at least part of an interface of the first conductivity type layer and the insulating layer.

9. The device according to claim 8, wherein third concave-convex structures are on at least part of an interface between the transparent conductive layer and the reflection metal layer.

10. The device according to claim 7, wherein first concave-convex structures are on at least part of an interface between the transparent conductive layer and the reflection metal layer.

11. The device according to claim 7, further comprising:
a plurality of second concave-convex structures on the second surface of the second conductivity type layer, the second concave-convex structures only on portions of the second surface which do not overlap with the second electrode when viewed from a direction orthogonal to a plane in which the second electrode is disposed.

12. The device according to claim 11, wherein one base angle of the second concave-convex structures is 90 degrees or more.

13. A semiconductor light emitting device comprising:
a light emitting layer;
a first electrode including a reflection metal layer;
a first conductivity type layer between the light emitting layer and the first electrode:
a second conductivity type layer having a first surface on a light emitting layer side and a second surface on a side opposite the first surface;
a second electrode on the second surface of the second conductivity type layer; and
a plurality of first concave-convex structures on at least a portion of a surface of the first conductivity type layer that is between the first conductivity type layer and the reflection metal layer,
the surface of the first conductivity type layer comprising a first region having first concave-convex structures and a second region not having first concave-convex structures,
the first region including all portions of the surface of the first conductivity type layer which overlap the second electrode when viewed from a direction orthogonal to a plane in which the second electrode is disposed, and
the second region including only portions of the surface of the first conductivity type layer which do not overlap with second electrode when viewed from the direction orthogonal to the plane in which the second electrode is disposed.

14. A semiconductor light emitting device comprising:
a light emitting layer;
a first electrode including a reflection metal layer;
a first conductivity type layer between the light emitting layer and the first electrode:
a second conductivity type layer having a first surface on a light emitting layer side and a second surface on a side opposite the first surface;
a second electrode on the second surface of the second conductivity type layer;
a plurality of first concave-convex structures on at least a portion of a surface of the first conductivity type layer that is between the first conductivity type layer and the reflection metal layer; and
a plurality of second concave-convex structures on the second surface of the second conductivity type layer, the second concave-convex structures only on portions of the second surface which do not overlap with the second electrode when viewed from a direction orthogonal to a plane in which the second electrode is disposed.

15. The device according to claim 14, wherein one base angle of the second concave-convex structures is 90 degrees or more.

16. A semiconductor light emitting device comprising:
a light emitting layer;
a first electrode including a reflection metal layer and a transparent conductive layer;
a first conductivity type layer provided between the light emitting layer and the transparent conductive layer of the first electrode;
a second conductivity type layer having a first surface on a light emitting layer side and a second surface on a side opposite side first surface;
a second electrode provided on the second surface of the second conductivity type layer;
a plurality of first concave-convex structures on at least a portion of a surface of the first conductivity type layer that is between the first conductivity type layer and the reflection metal layer; and
a plurality of second concave-convex structures on the second surface of the second conductivity type layer, the second concave-convex structures only on portions of the second surface which do not overlap with the second electrode when viewed from a direction orthogonal to a plane in which the second electrode is disposed.

17. The device according to claim 16, wherein one base angle of the second concave-convex structures is 90 degrees or more.

* * * * *